United States Patent
Chen et al.

(10) Patent No.: US 10,879,159 B2
(45) Date of Patent: Dec. 29, 2020

(54) SUBSTRATE, SEMICONDUCTOR PACKAGE THEREOF AND PROCESS OF MAKING SAME

(71) Applicant: ADVANCED SEMICONDUCTOR ENGINEERING, INC., Kaohsiung (TW)

(72) Inventors: Tien-Szu Chen, Kaohsiung (TW); Sheng-Ming Wang, Kaohsiung (TW); Kuang-Hsiung Chen, Kaohsiung (TW); Yu-Ying Lee, Kaohsiung (TW)

(73) Assignee: ADVANCED SEMICONDUCTOR ENGINEERING, INC., Kaohsiung (TW)

(*) Notice: Subject to any disclaimer, the term of this patent is extended or adjusted under 35 U.S.C. 154(b) by 50 days.

(21) Appl. No.: 14/704,769

(22) Filed: May 5, 2015

(65) Prior Publication Data

US 2015/0318235 A1 Nov. 5, 2015

(30) Foreign Application Priority Data

May 5, 2014 (CN) .......................... 2014 1 0186379

(51) Int. Cl.
*H01L 23/498* (2006.01)
*H01L 23/495* (2006.01)
*H01L 21/48* (2006.01)

(52) U.S. Cl.
CPC .... *H01L 23/49816* (2013.01); *H01L 21/4828* (2013.01); *H01L 23/49503* (2013.01);
(Continued)

(58) Field of Classification Search
CPC ................ H05K 1/112; H05K 3/4638; H05K 2201/0385; H05K 2201/09709;
(Continued)

(56) References Cited

U.S. PATENT DOCUMENTS

| 5,886,877 A | * | 3/1999 | Shingai | ............... H01L 21/4853 174/255 |
| 5,939,952 A | * | 8/1999 | Noda | .................. H01B 7/0876 174/250 |

(Continued)

FOREIGN PATENT DOCUMENTS

| CN | 1326225 A | 12/2001 |
| CN | 101814481 B | 8/2010 |

(Continued)

OTHER PUBLICATIONS

Definition of "trace" from www.yourdictionary.com, Dec. 1, 2016.*
(Continued)

*Primary Examiner* — Roshn K Varghese
(74) *Attorney, Agent, or Firm* — Foley & Lardner LLP

(57) ABSTRACT

A substrate, a semiconductor package thereof and a process of making the same are provided. The substrate comprises an upper circuit layer and a lower circuit layer, the upper circuit layer comprising at least one trace and at least one pad and the lower circuit layer comprising at least one trace and at least one pad, wherein the trace of the upper circuit layer and the trace of the lower circuit layer are not aligned.

18 Claims, 17 Drawing Sheets

(52) U.S. Cl.
CPC .. *H01L 23/49534* (2013.01); *H01L 23/49582* (2013.01); *H01L 23/49811* (2013.01); *H01L 23/49833* (2013.01); *H01L 23/49861* (2013.01); *H01L 23/49894* (2013.01); *H01L 2224/16225* (2013.01); *H01L 2224/32225* (2013.01); *H01L 2224/48091* (2013.01); *H01L 2224/48227* (2013.01); *H01L 2224/73265* (2013.01); *H01L 2924/15311* (2013.01); *H01L 2924/181* (2013.01)

(58) Field of Classification Search
CPC ... H05K 2201/098; H05K 2201/09818; H05K 2201/09218; H05K 2201/09227; H05K 2201/09236; H05K 2201/09336; H05K 2201/09663; H01L 23/49816; H01L 23/4828; H01L 23/49503; H01L 23/49534; H01L 23/49894; H01L 23/49861; H01L 23/49582; H01L 23/49833; H01L 23/49811; H01L 2924/181; H01L 2224/32225; H01L 2224/48227; H01L 2224/73265; H01L 2224/16225; H01L 2224/48091; H01L 2924/15311

See application file for complete search history.

(56) References Cited

U.S. PATENT DOCUMENTS

| | | | |
|---|---|---|---|
| 6,259,162 B1 * | 7/2001 | Ma | H01L 21/76838 257/621 |
| 6,351,885 B2 * | 3/2002 | Suzuki | H01L 21/4853 257/E23.004 |
| 6,496,886 B1 * | 12/2002 | Osaka | H01P 5/185 333/109 |
| 6,646,349 B1 * | 11/2003 | Pu | H01L 21/485 174/260 |
| 6,759,271 B2 * | 7/2004 | Miyazaki | H01L 21/568 257/E21.506 |
| 6,972,152 B2 * | 12/2005 | Taggert | C23C 30/00 174/257 |
| 7,026,545 B2 * | 4/2006 | Barr | H05K 1/0216 174/117 F |
| 7,632,708 B2 | 12/2009 | Haba et al. | |
| 9,282,640 B2 * | 3/2016 | Kwon | H01L 21/4853 |
| 2008/0194322 A1 | 8/2008 | Sakuma | |
| 2009/0194322 A1 * | 8/2009 | Usui | H05K 3/0032 174/260 |
| 2010/0009554 A1 * | 1/2010 | Ryu | H01L 21/4846 439/65 |
| 2011/0193222 A1 | 8/2011 | Usui et al. | |
| 2012/0061132 A1 * | 3/2012 | Kang | H05K 1/111 174/257 |
| 2012/0280390 A1 | 11/2012 | Do et al. | |
| 2013/0009311 A1 | 1/2013 | Lin et al. | |
| 2013/0026636 A1 * | 1/2013 | Tani | H01L 23/49822 174/257 |
| 2014/0009899 A1 * | 1/2014 | Ito | H05K 1/188 174/255 |
| 2015/0289362 A1 * | 10/2015 | Tanaka | H05K 1/0219 174/262 |

FOREIGN PATENT DOCUMENTS

| | | |
|---|---|---|
| CN | 102027591 A | 4/2011 |
| CN | 201898130 U | 7/2011 |
| CN | 102244972 A | 11/2011 |
| CN | 102768959 A | 11/2012 |
| CN | 10286780 A | 1/2013 |
| CN | 103460819 A | 12/2013 |

OTHER PUBLICATIONS

Office Action in counterpart Chinese Patent Application No. 201410186379.X, dated Jun. 2, 2017, 11 pages.
Office Action and Search Report for corresponding Chinese Patent Application No. 201410186379.X, dated Feb. 11, 2018, 13 pages.

* cited by examiner

SUBSTRATE, SEMICONDUCTOR PACKAGE THEREOF AND PROCESS OF MAKING SAME

CROSS-REFERENCE TO RELATED PATENT APPLICATIONS

This application claims the benefit of and priority to P.R.C. (China) Patent Application No. 201410186379.X filed on May 5, 2014, the contents of which are incorporated herein by reference in their entirety.

BACKGROUND

1. Field of the Disclosure

The subject application relates to a substrate for semiconductor package and a process of making the same.

2. Description of the Related Art

With miniaturization of integrated circuit (IC) products, and increasing demands on the number of available input/output (I/O) connections, new packaging types are sought.

SUMMARY

An embodiment of the subject application relates to a substrate with an upper circuit layer and a lower circuit layer. The upper circuit layer includes at least one trace and at least one pad, and the lower circuit layer includes at least one trace and at least one pad. The trace of the upper circuit layer and the trace of the lower circuit layer are not aligned.

Another embodiment of the subject application relates to a semiconductor package including a substrate with an upper circuit layer and a lower circuit layer. The upper circuit layer includes at least one trace and at least one pad, and the lower circuit layer includes at least one trace and at least one pad. The upper circuit layer and the trace of the lower circuit layer are not aligned. A die is electrically connected to the upper circuit layer.

A further embodiment of the subject application relates to a process of making a substrate, including: providing a conductive layer with a first surface and a second surface, patterning the first surface to form at least one first trace and at least one first pad, and patterning the second surface to form at least one second trace and at least one second pad.

DETAILED DESCRIPTION

Figure 1:
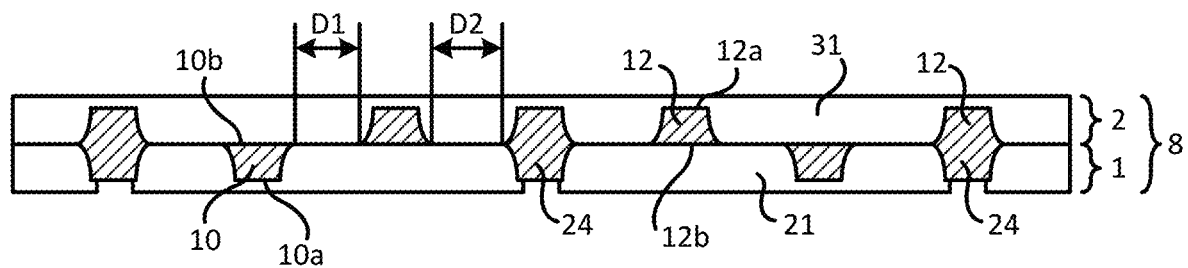
FIG. 1 is a cross-sectional diagram of a substrate, which is a profile along C-C' of FIG. 6 according to an embodiment of the subject application.
Figure 6:
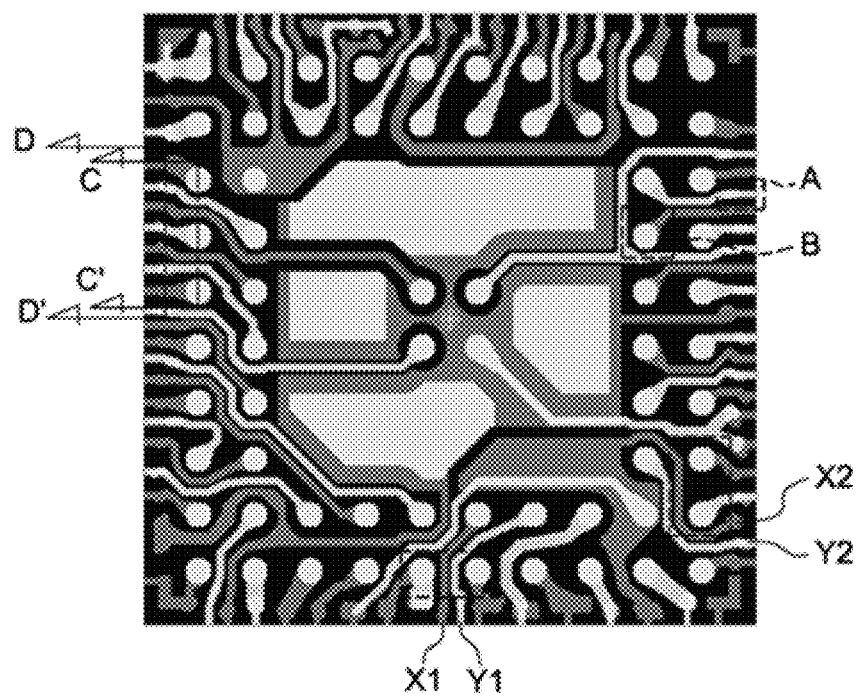
FIG. 6 is a top-view diagram of an embodiment of a circuit pattern formed through a combination of a lower circuit layer and an upper circuit layer.

FIG. 1 is a cross-sectional diagram of a substrate, which is a profile along C-C' of FIG. 6 according to an embodiment of the subject application. As shown in FIG. 1, a substrate 8 includes a lower circuit layer 1 with lower traces 10 and pads 24. The lower traces 10 are electrically isolated from each other. The substrate 8 also includes an upper circuit layer 2 with upper traces 12 and pads (not shown) located above the lower circuit layer 1. The upper traces 12 are electrically isolated from each other. The lower circuit layer 1 and the upper circuit layer 2 are formed from a single conductive layer, such as, for example, copper. Each upper trace 12 of the upper circuit layer 2 has an upper surface 12a and a lower surface 12b. Each lower trace 10 of the lower circuit layer 1 has an upper surface 10a and a lower surface 10b. The lower surface 12b and the lower surface 10b are substantially in the same plane.

The lower traces 10 and the upper traces 12 are not aligned in the illustration of FIG. 1; in other words, a minimum distance D1 between a lower trace 10 and an upper trace 12 is greater than zero. The minimum distance D1 is less than a minimum distance D2 (e.g., trace spacing or pitch) between two upper traces 12 (or a minimum trace spacing or pitch between two lower traces 10).

Traces generally may be formed as lower traces 10 or upper traces 12. The formation of the traces as lower traces 10 or upper traces 12 may, in some instances, be based upon process capabilities, such as trace line width and trace line spacing. For example, when a distance between adjacent pads 24 is a fixed value (e.g., 310 µm), and trace line width and trace line spacing are respectively 50 µm and 70 µm, the number of lower traces 10 passing between two adjacent pads 24 may be selected as one lower trace 10 to allow for process variation (the use of two lower traces 10 at 50 µm each, plus three spaces at 70 µm each, adds to 310 µm, which does not allow for process variation). In such a case, additional traces may be routed as upper traces 12. As illustrated for the portion of the embodiment illustrated in FIG. 1 (and as can be seen in the top view in FIG. 6 along line C-C'), two traces are routed between adjacent pads 24, where one trace is routed as a lower trace 10, and one trace is routed as an upper trace 12. Some upper traces 12 of the upper circuit layer 2 and some lower traces 10 of the lower circuit layer 1 may be staggered.

In one or more embodiments, a sidewall contour of each of the lower traces 10 and upper traces 12 is a result of an etching technology used to form the lower circuit layer 1 and the upper circuit layer 2 from a single conductive layer, as described below. In one or more embodiments, as illustrated in FIG. 1, a sidewall contour of the upper traces 12 of the upper circuit layer 2 may be arcuate, such that a width of the upper surface 12a is less than a width of the lower surface 12b. In one or more embodiments, a sidewall contour of the lower traces 10 of the lower circuit layer 2 may be arcuate, such that a width of the upper surface 10a is less than a width of the lower surface 10b, as illustrated in FIG. 1.

In one or more embodiments, the upper traces 12 of the upper circuit layer 2 and the pads (ball pads) 24 of the lower circuit layer 1 may overlap, as illustrated in FIG. 1 (and see also Region B in FIG. 6). For example, an upper trace 12 and a pad 24 may overlap so as to electrically connect the pad 24 to a position on the substrate 8 at a distance from the pad 24.

The substrate 8 may include a protective material surrounding the upper traces 12 of the upper circuit layer 2 and the lower traces 10 of the lower circuit layer 1. The protective material may include an upper protective layer 31 surrounding and covering the upper traces 12, and a lower protective layer 21 surrounding and covering the lower traces 10. The lower protective layer 21 may have openings to expose the pads 24, as illustrated in FIG. 1, such as to allow solder balls to be formed thereon.

In one or more embodiments, the lower protective layer 21 and the upper protective layer 31 may be made of photosensitive materials such as photosensitive polymers, which, for example, may be selected from, but are not limited to, polyparaphenylene benzobisoxazole (PBO), polyimide, benzocyclobutene or a combination thereof. By using photosensitive materials and a lithography process, the lower protective layer 21 can include openings through which the lower circuit layer 1 (e.g., pads 24) is exposed, and the upper protective layer 31 can include openings through which the upper circuit layer 2 is exposed (e.g., pads 18 in FIG. 2). In other embodiments, one or both of the lower protective layer 21 and the upper protective layer 31 are solder resist layers. A solder resist layer may include, for example, photosensitive polymers.

Figure 2:
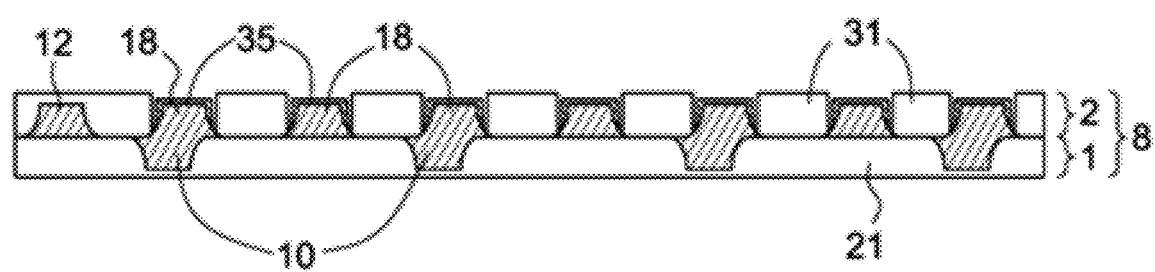
FIG. 2 is a cross-sectional diagram of a substrate, which is a profile along D-D' of FIG. 6 according to an embodiment of the subject application.

FIG. 2 is a cross-sectional diagram of a substrate, which is a profile along D-D' of FIG. 6 according to an embodiment of the subject application. Similarly to the profile view along C-C' as illustrated in FIG. 1, the substrate 8 of FIG. 2 includes the lower circuit layer 1 with lower traces 10 and pads (not shown), where the lower traces 10 are electrically isolated from each other; and the upper circuit layer 2 with upper traces 12 is located above the lower circuit layer 1, where the upper traces 12 are electrically isolated from each other. The upper circuit layer 2 further includes pads 18. The pads 18 may have a surface finish layer 35 thereon; for example, a surface finish layer 35 of nickel, gold, or a combination thereof, or stacked nickel/gold layers. The surface finish layer 35 serves as a wire bond contact, for example, for wire bonding to a semiconductor chip. In one or more embodiments, the pads (fingers) 18 of the upper circuit layer 2 and the lower traces 10 of the lower circuit layer 1 may overlap, as illustrated in FIG. 2 (and see also Region A of FIG. 6). For example, a lower trace 10 and a pad 18 may overlap so as to electrically connect the pad 18 to a position on the substrate 8 at a distance from the pad 18.

Figure 3:
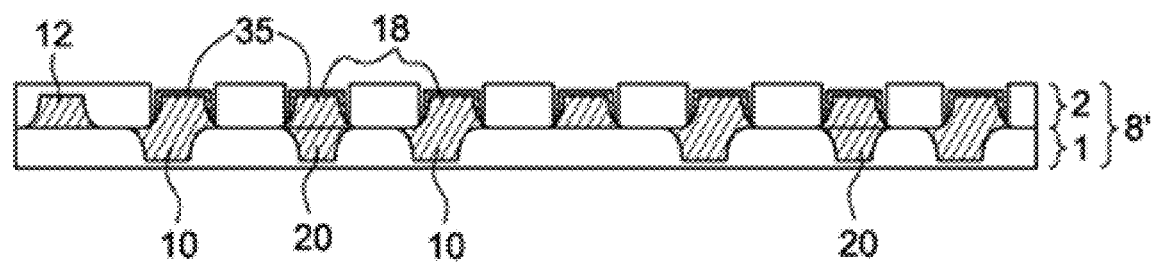
FIG. 3 is a cross-sectional diagram of an embodiment of a substrate according to the subject application.

FIG. 3 is a cross-sectional diagram of another embodiment of a substrate according to the subject application. The substrate 8' is different from the substrate 8 of FIGS. 1 and 2 in that a reinforcing layer 20 is included, and portions of the reinforcing layer 20 are positioned below some of the pads 18, to enhance the strength of the pads 18 where wires bond. The lower circuit layer 1 and the upper circuit layer 2 are formed of conductive materials, such as, for example, copper. In one or more embodiments, the reinforcing layer 20 may be a conductive layer made of the same material as that of the lower traces 10. The lower traces 10 and the reinforcing layer 20 may be formed in the same process. A shape and size of the reinforcing layer may vary according to design needs. For example, a width or a length of portions of the reinforcing layer 20 may be less than those of the lower traces 10.

In one or more embodiments, a lower protective layer 21 and an upper protective layer 31 may be made of photosensitive materials such as photosensitive polymers, which, for example, may be selected from, but are not limited to, polyparaphenylene benzobisoxazole (PBO), polyimide, benzocyclobutene or a combination thereof. By using photosensitive materials and a lithography process, the lower protective layer 21 can include openings through which the lower circuit layer 1 (e.g., pads 24) is exposed, and the upper protective layer 31 can include openings through which the upper circuit layer 2 (e.g., pads 18) is exposed. In other embodiments, one or both of the lower protective layer 21 and the upper protective layer 31 are solder resist layers. A solder resist layer may include, for example, photosensitive polymers.

Figure 4:
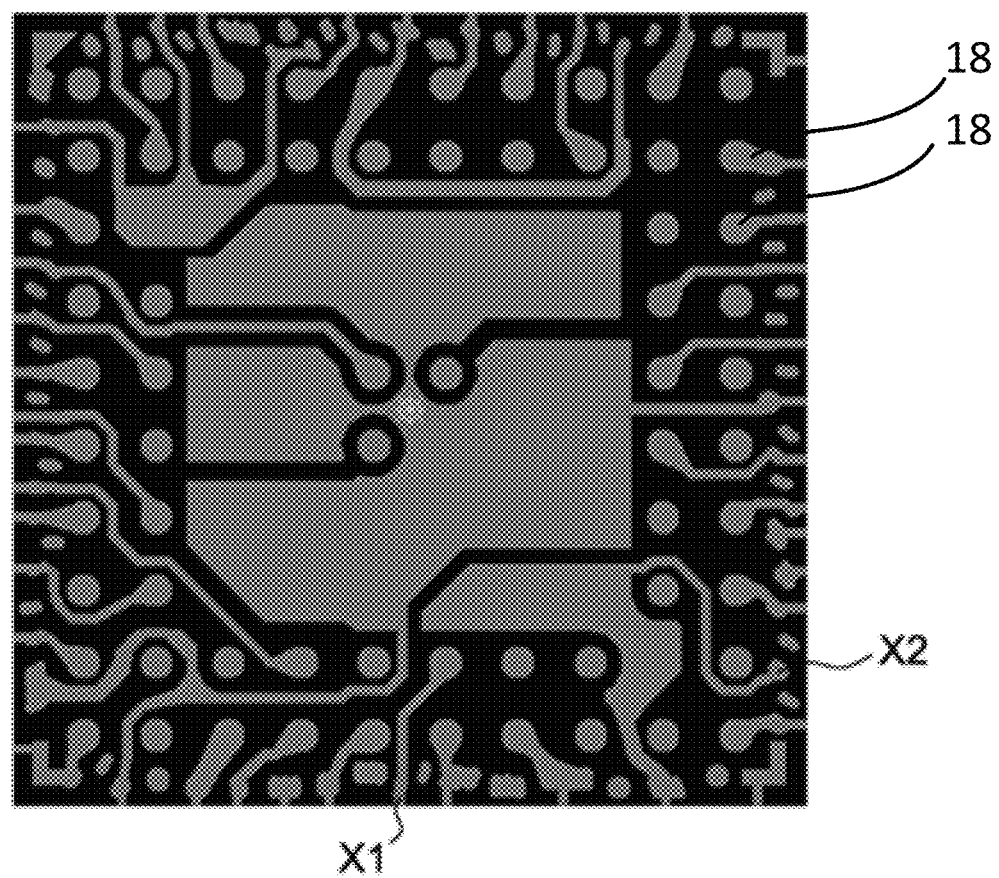
FIG. 4 is a top-view diagram of an embodiment of an upper circuit layer.
Figure 5:
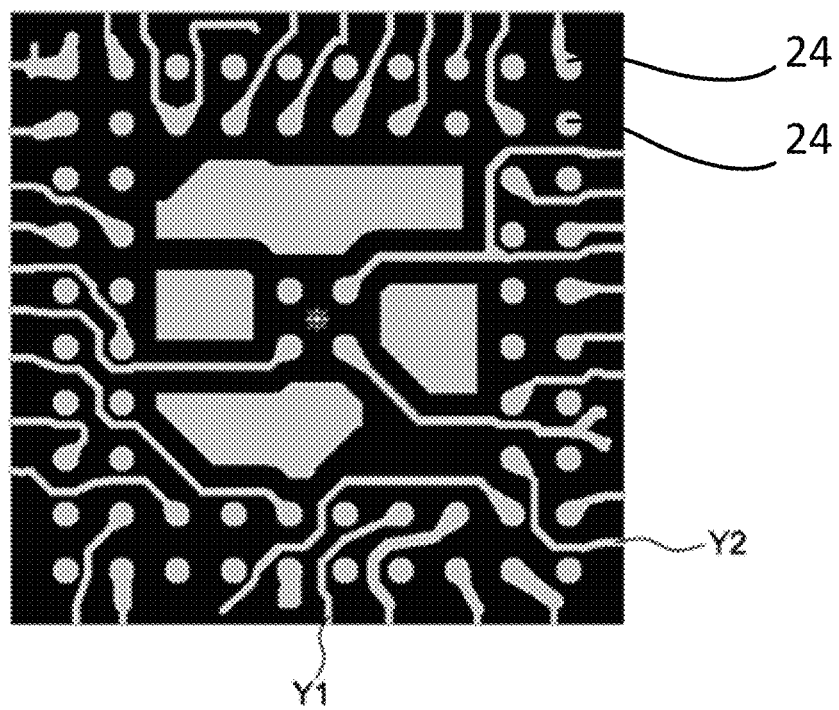
FIG. 5 is a top-view diagram of an embodiment of a lower circuit layer.

FIGS. 4 to 6 illustrate examples of circuit layer designs: FIG. 4 is a top-view diagram of an embodiment of an upper circuit layer 2; FIG. 5 is a top-view diagram of an embodiment of a lower circuit layer 1; and FIG. 6 is a top-view diagram of an embodiment of a circuit pattern formed through a combination of the upper circuit layer 2 of FIG. 4 and the lower circuit layer 1 of FIG. 5. Many other designs are also possible, and are within the scope of this disclosure. As shown in FIG. 4, in some embodiments, the pads 18 (e.g., as shown as lighter-shaded shapes) may be positioned on the upper circuit layer 2 to accommodate, for example, connection to a particular pad arrangement of a semiconductor die; and as shown in FIG. 5, in some embodiments, the pads 24 (shown as circular, lighter-colored shapes) may be positioned on the lower circuit layer 1 to connect, for example, to another device or to a circuit board. As can be seen in FIG. 6, with the pattern of the upper circuit layer 2 of FIG. 4 overlaid on the pattern of the lower circuit layer 1 of FIG. 5, the techniques of this disclosure provide for a dense routing of traces. For example, trace X1 in upper circuit layer 2 (FIG. 4) and trace Y1 in lower circuit layer 1 (FIG. 5) are both positioned between two adjacent pads 18 (and between two adjacent pads 24—the adjacent pads 18 are aligned with the adjacent pads 24 in this example); and trace X2 in circuit layer 2 (FIG. 4) and trace Y2 in circuit layer 1 (FIG. 5) are both positioned between two adjacent pads 18 (and between two adjacent pads 24—the adjacent pads 18 are aligned with the adjacent pads 24 in this example). Routing in this manner, using an upper circuit layer 2 and a lower circuit layer 1, allows for more traces through a cross-sectional area than could be implemented with a single circuit layer; consequently, more I/O connections may be made. Further, because the traces are dispersed on two layers (lower circuit layer 1 and upper circuit layer 2), etching tolerances may be increased, yield may be improved, and manufacturing costs may be reduced.

Also shown in FIG. 6 is that traces of the lower circuit layer 1 (e.g., lower traces 10 in FIG. 2) and pads of the upper circuit layer 2 (e.g., pads 18 in FIG. 2) may at least partially overlap, and traces of the upper circuit layer 2 (e.g., upper traces 12 in FIG. 1) and pads of the lower circuit layer 1 (e.g., pads 24 in FIG. 1) may at least partially overlap, allowing for electrical connection between the lower circuit layer 1 and the upper circuit layer 2.

Figure 7A:
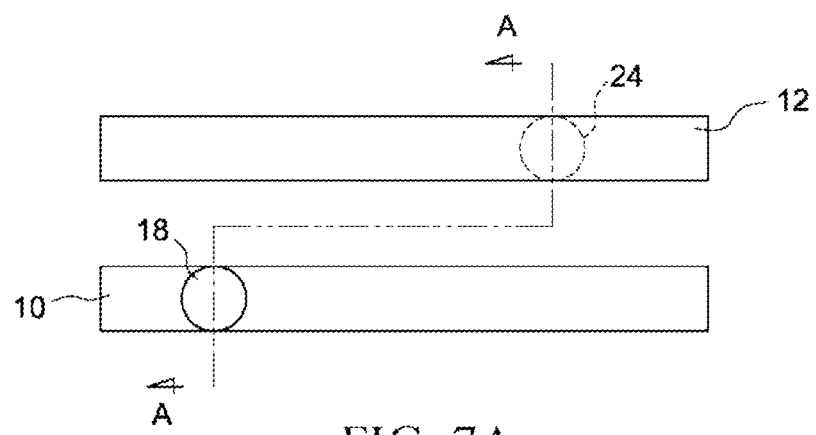
FIG. 7A is a top-view diagram of an embodiment of relative positions of two adjacent traces of a substrate according to the subject application.
Figure 7B:
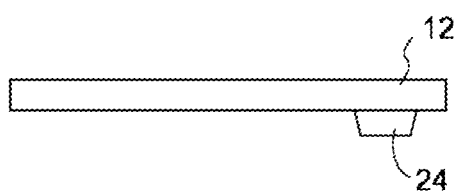
FIG. 7B is a front-view diagram, relative to the direction of FIG. 7A, of an embodiment of upper traces 12 and pads 24 of the substrate of FIG. 7A.
Figure 7C:
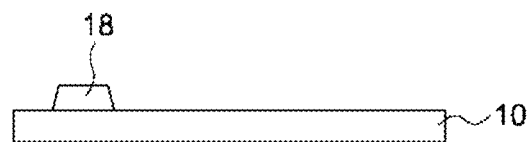
FIG. 7C is a front-view diagram, relative to the direction of FIG. 7A, of an embodiment of lower traces 10 and pads 18 of the substrate of FIG. 7A.
Figure 7D:
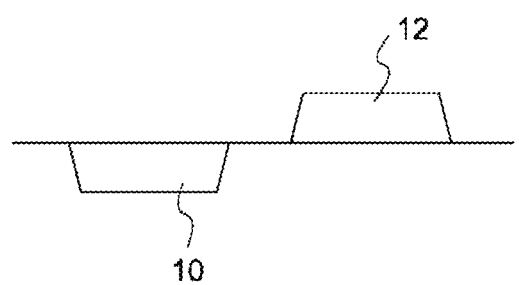
FIG. 7D is a side-view diagram, relative to the direction of FIG. 7A, of an embodiment of two adjacent traces 10 and 12 of the substrate of FIG. 7A.

FIGS. 7A to 7D illustrate relative trace and pad positioning according to an embodiment of the subject application. FIG. 7A is a top-view diagram of relative positions of two adjacent traces (e.g., traces X1, Y1 or X2, Y2 of FIG. 6): an upper trace 12 of upper circuit layer 2 and a lower trace 10 of lower circuit layer 1. FIG. 7B is a front-view diagram, relative to the direction of FIG. 7A, of the upper trace 12 and the pad 24 of FIG. 7A. FIG. 7C is a front-view diagram, relative to the direction of FIG. 7A, of the lower traces 10 and the pad 18 of FIG. 7A. FIG. 7D is a side-view diagram, relative to the direction of FIG. 7A, of the two adjacent traces (lower trace 10 and upper trace 12) of FIG. 7A. As shown in FIG. 7B, some of the pads 24 may overlap with the upper traces 12. As shown in FIG. 7C, some of the pads 18 may overlap with the lower traces 10. As shown in FIG. 7D, adjacent traces 10 and 12 may be designed as part of the upper circuit layer 1 and part of the lower circuit layer 2, respectively.

Figure 8A:
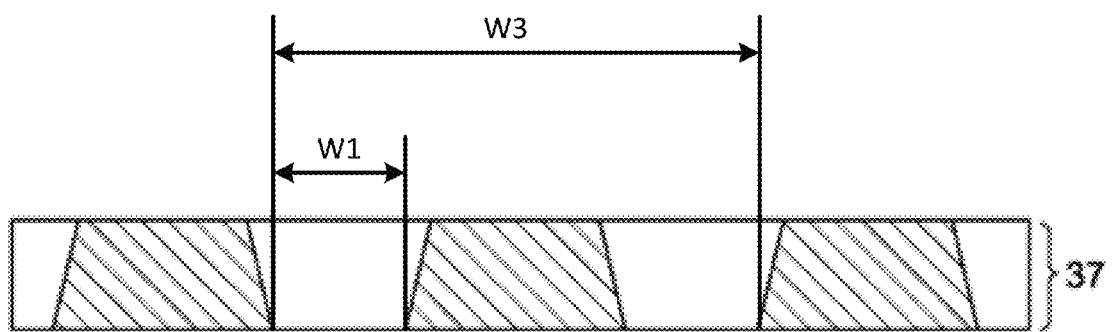
FIG. 8A is a diagram of an embodiment of a single-layer circuit pattern.
Figure 8B:
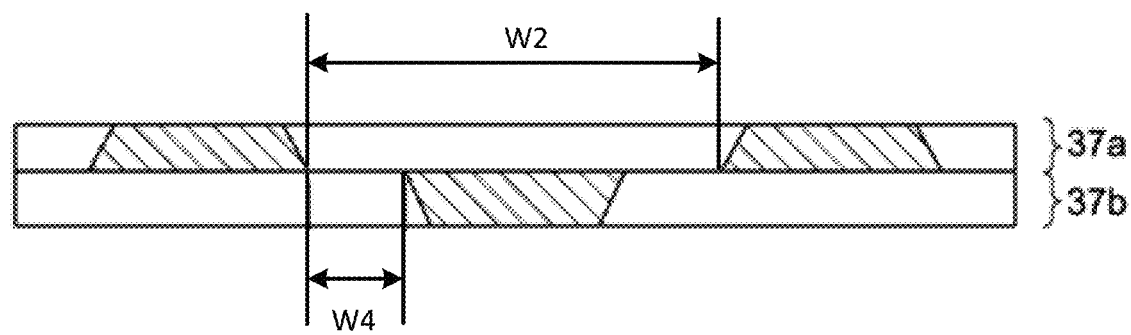
FIG. 8B is a diagram of an embodiment of a two layer circuit pattern.

FIGS. 8A and 8B illustrate a comparison of a single circuit layer implementation versus a two circuit layer implementation, showing the benefits of implementation in two circuit layers. FIG. 8A is a cross-section diagram of an embodiment of a single-layer circuit pattern 37. FIG. 8B is a cross-section diagram of an embodiment of a two-layer circuit pattern including an upper circuit layer 37a and a lower circuit layer 37b. In this comparison, a total thickness of the two layers 37a and 37b is equivalent to a thickness of the single-layer circuit pattern 37. However, the same number of traces (three) is illustrated in both FIG. 8A and FIG. 8B. Therefore, a spacing W2 between two adjacent circuits on the upper circuit layer 37a (or between two adjacent circuits on the lower circuit layer 37b) may be greater than a spacing W1 between two adjacent circuits in the single-layer embodiment of FIG. 8A (i.e. W2>W1). Accordingly, etching tolerance increases, and yield in etching may be improved. Alternatively, if etching tolerances of the two-layer circuit implementation are the same as for the single-layer circuit implementation, the spacing W2 between a first and a third trace in the two-layer circuit implementation may be less than a spacing W3 between a first and third trace in the single-layer circuit implementation. In other words, a spacing W4 between two adjacent circuits in the upper circuit layer 37a and the lower circuit layer 37b may be less than the spacing W1; hence, wiring design flexibility may be improved, circuit density may be improved, and process yield may be improved.

Figure 9:
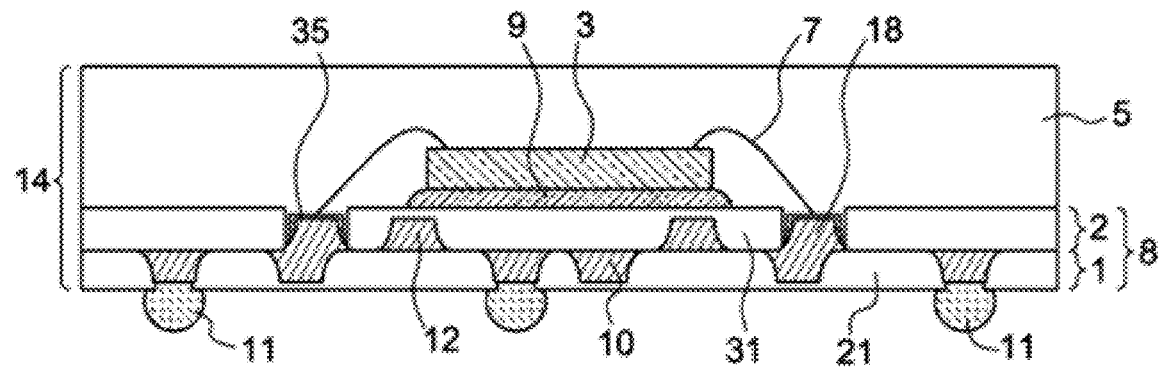
FIG. 9 is a diagram of an embodiment of a semiconductor package according to the subject application.

FIG. 9 is a diagram of an embodiment of a semiconductor package according to the subject application. A semiconductor package 14 comprises a substrate 8 with a lower circuit layer 1 and an upper circuit layer 2, a die 3, an adhesive 9, pads 18, wires 7 and a package material 5. The die 3 is attached to the substrate 8 with adhesive 9, and the pads 18 are formed in an opening of an upper protective layer 31 of substrate 8, for connection with the wires 7. The package material 5 is located on the upper protective layer 31, and encapsulates the die 3 and the adhesive 9. In one or more embodiments, solder balls 11 are formed on the lower circuit layer 1 (pads) exposed from openings of a lower protective layer 21 of substrate 8 to serve as an external connection. In other embodiments, electroplating tin may also be formed on the lower circuit layer 1 (pads) exposed in the openings of the lower protective layer 21 to serve as an external connection.

Figure 10:
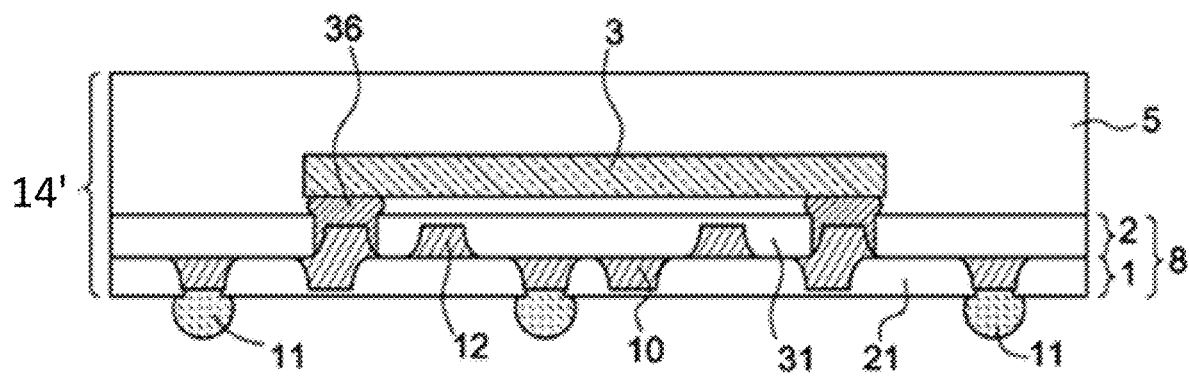
FIG. 10 is a diagram of another embodiment of a semiconductor package according to the subject application.

FIG. 10 is a diagram of another embodiment of a semiconductor package according to the subject application. A semiconductor package 14' is different from the semiconductor package 14 shown in FIG. 9, in that the die 3 of FIG. 10 is electrically connected with the upper circuit layer 2 of the substrate 8 through solder balls 36 in a flip chip form. In one or more embodiments, solder balls 11 may be formed on the lower circuit layer 1 (pads) exposed in the openings of a lower protective layer 21 to serve as an external connection.

Figure 11:
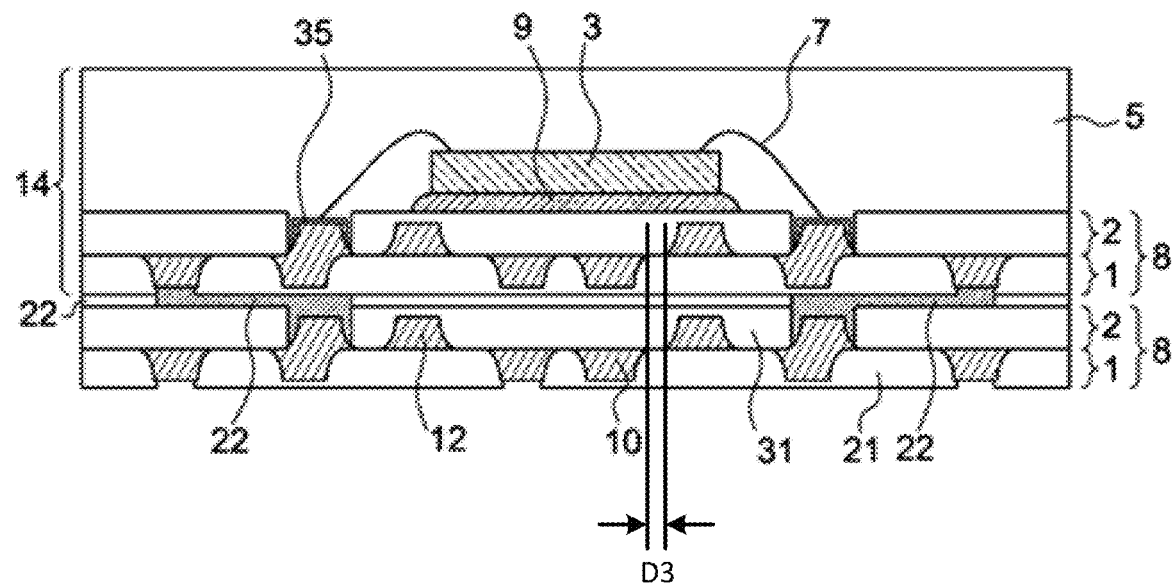
FIG. 11 is a diagram of a further embodiment of a semiconductor package according to the subject application.

FIG. 11 is a diagram of a further embodiment of a semiconductor package according to the subject application. The semiconductor package is different from the semiconductor package 14 shown in FIG. 9, in that the semiconductor package of FIG. 11 includes a second substrate 8. The two substrates 8 are electrically connected by, for example, a conductive adhesive 22, which may be patterned. The two substrates 8 may be formed in the same manner, and each substrate 8 may include an upper circuit layer 2 and a lower circuit layer 1. In one or more embodiments, a minimum distance D3 between an upper trace 12 included in the upper circuit layer 2 of a substrate 8 and a lower trace 10 included in the lower circuit layer 1 of the substrate 8 is greater than zero. The minimum distance D3 may be less than minimum trace spacing (pitch) corresponding to the process used to form the lower circuit layer 1 and the upper circuit layer 2. In one or more embodiments, solder balls (not shown) may be formed on a lower circuit layer 1 (pads) exposed in openings of a lower protective layer 21 of one substrate 8 to serve as an external connection for the one substrate 8.

Figure 12A:
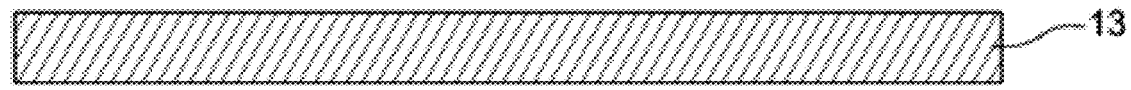
FIGS. 12A, 12B, 12C, 12D, 12E, 12F, 12G, 12H, 12I, 12J, 12K, 12L, 12M, 12N, 12O, 12P, 12Q and 12R are diagrams of an embodiment of a process of making a substrate according to the subject application.
Figure 12B:
Figure 12C:
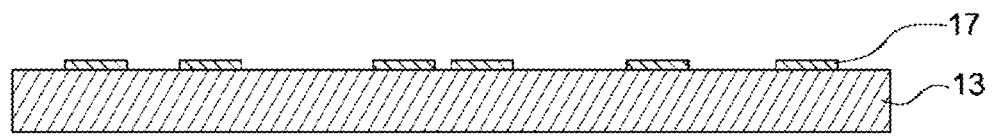
Figure 12D:
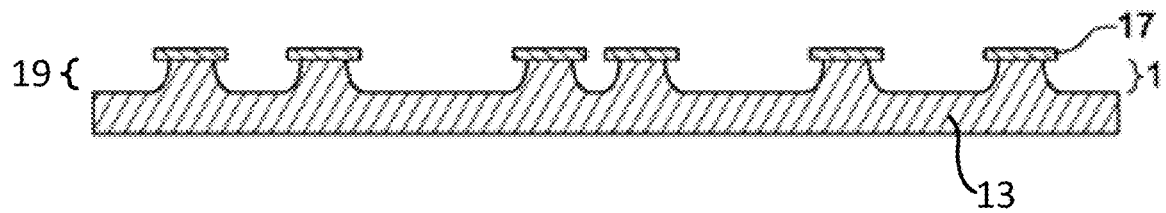
Figure 12E:
Figure 12F:
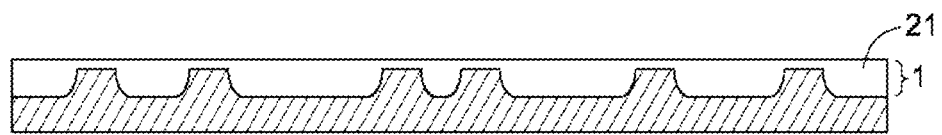
Figure 12G:
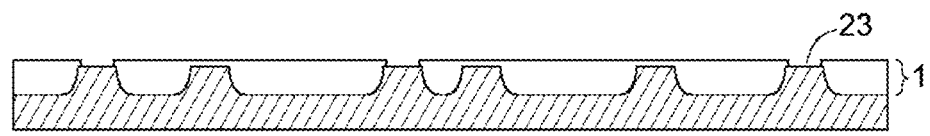
Figure 12H:
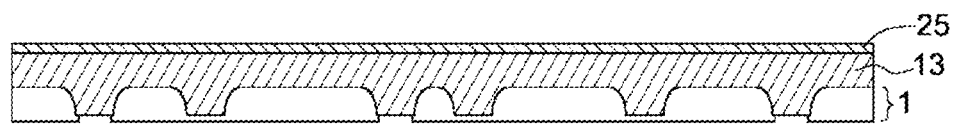
Figure 12I:
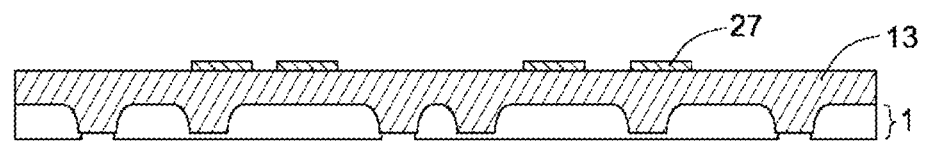
Figure 12J:
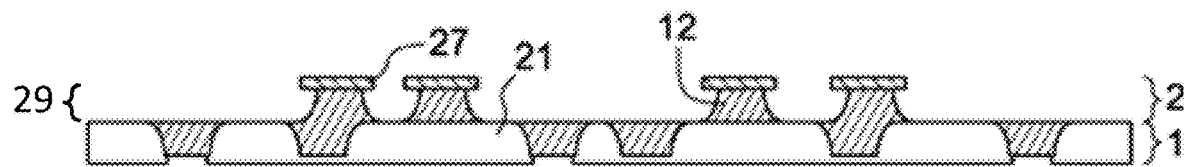
Figure 12K:
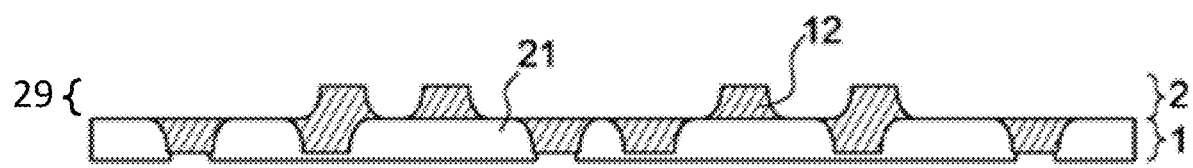
Figure 12L:
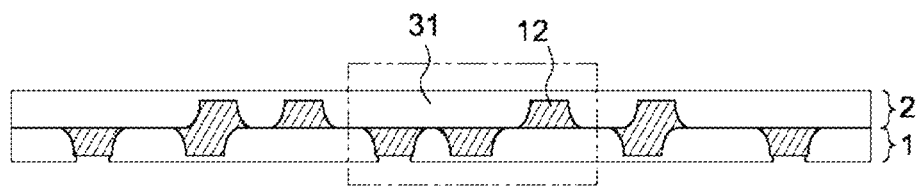
Figure 12M:
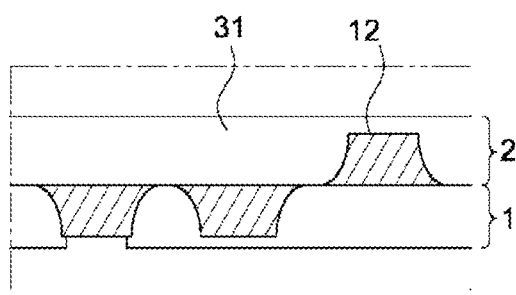
Figure 12N:
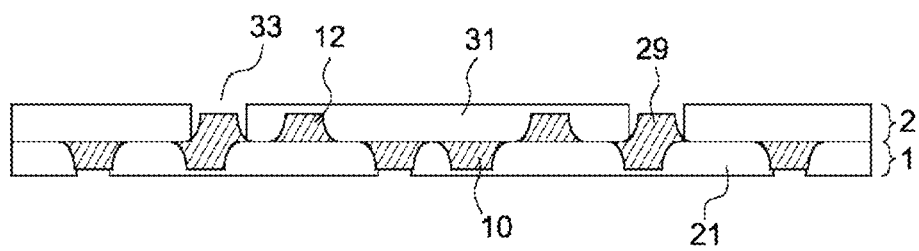
Figure 12O:
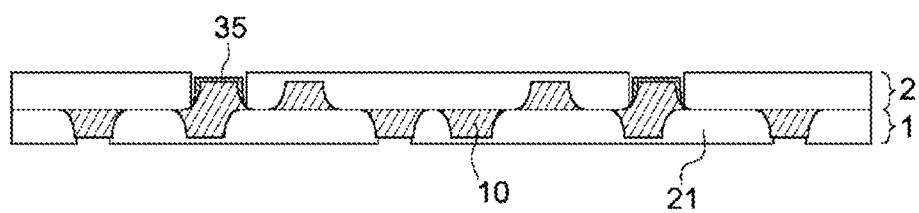
Figure 12P:
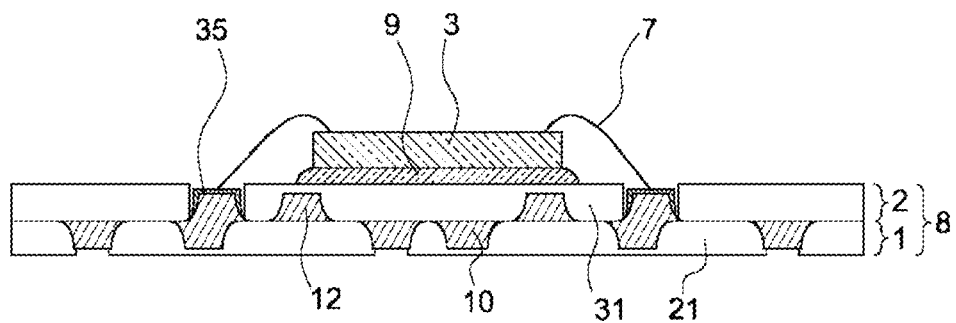
Figure 12Q:
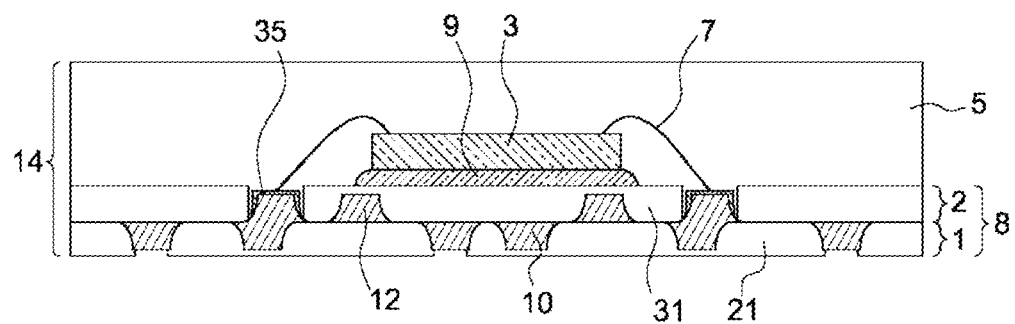
Figure 12R:
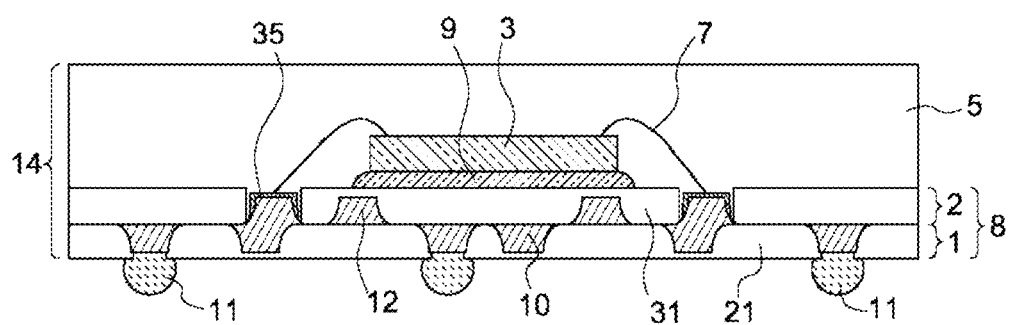

FIGS. 12A to 12R are diagrams of an embodiment of a process of making a substrate according to the subject application.

Referring to FIG. 12A, a conductive layer 13 is provided. Conductive layer 13 may be a metal, such as, for example, copper, or may be another conductive material. Referring to FIG. 12B, a first dry film 15 is formed on the conductive layer 13. Referring to FIG. 12C, the first dry film 15 is patterned into a patterned first dry film 17, to expose part of the conductive layer 13, and to define positions for traces and pads of a circuit layer to be subsequently formed. The patterning process may include, for example, a lithographic technique.

Referring to FIG. 12D, part of the conductive layer 13 is removed, to form traces and pads 19 of a lower circuit layer 1. The conductive layer 13 may be removed by etching or by other techniques. In one or more embodiments, the conductive layer 13 is removed by etching, such that a sidewall contour of traces of the lower circuit layer 1 is not a plane. For example, as shown in FIG. 12D, the sidewall contour may be arcuate. Referring to FIG. 12E, the patterned first dry film 17 is removed, to expose the traces and pads 19 of the lower circuit layer 1.

Referring to FIG. 12F, a lower protective layer 21 is formed on the lower circuit layer 1. The lower protective layer 21 surrounds and covers the traces and pads 19 of the lower circuit layer 1. In some embodiments, the lower protective layer 21 may be formed through spin coating, spray coating or lamination. Referring to FIG. 12G, the lower protective layer 21 is patterned, to form openings 23 and thereby define positions in the lower circuit layer 1 where pads are to be formed. The patterning process may include a lithographic technique.

Referring to FIG. 12H, a second dry film 25 is formed on a surface of the conductive layer 13 opposite where the lower circuit layer 1 is formed. Referring to FIG. 12I, the second dry film 25 is patterned to form a patterned second dry film 27, to expose part of the conductive layer 13, and to define positions for traces and pads to be subsequently formed. The patterning process may include a lithographic technique. Referring to FIG. 12J, a part of the conductive layer 13 not covered by the patterned second dry film 27 is removed from the conductive layer 13, to form an upper circuit layer 2 with traces and pads 29, including upper traces 12. The conductive layer 13 may be removed through etching or by other techniques. As shown in FIG. 12J, sidewalls of the traces and pads 29 of the upper circuit layer 2 generated by removing the conductive layer 13 through etching may be arcuate.

Referring to FIG. 12K, the patterned second dry film 27 is removed. Referring to FIG. 12L, an upper protective layer 31 is formed, and the upper protective layer 31 surrounds and covers the traces and pads 29 of the upper circuit layer 2. In some embodiments, the upper protective layer 31 may be formed through spin coating, spray coating or lamination. The region within the dotted line in FIG. 12L is enlarged in FIG. 12M. As shown in FIG. 12M (and FIGS. 12J to 12L), in embodiments in which etching is used to remove portions of the conductive layer 13 to form the traces and pads 19 of the circuit layer 1 and the traces and pads 29 of the circuit layer 2, the sidewalls of the traces and pads 19 of the lower circuit layer 1 and the sidewalls of the traces and pads 29 of the upper circuit layer 1 arc such that a width of a top surface of the traces and pads 19, 29 is less than a width of a bottom surface of the traces and pads 19, 29. Referring to FIG. 12N, the upper protective layer 31 is patterned, to form openings 33, and to define positions in the upper circuit layer 2 where pads or fingers are to be formed. The patterning process may include a lithographic technique. Referring to FIG. 12O, a conductive surface finish layer 35 (e.g., nickel, gold, or a combination thereof, or a stacked nickel/gold layer) may be formed on the pads in the upper circuit layer 1, to facilitate subsequent wire bonding. The surface finish layer 35 may be formed at an opening of the upper protective layer 31 through immersion, plating, chemical plating, printing, or with other techniques.

Referring to FIG. 12P, a die 3 may be attached to the upper circuit layer 2 by means of an adhesive 9, and may be electrically connected with the surface finish layer 35 of the upper circuit layer 2 by way of wires 7. Referring to FIG. 12Q, the die 3 is covered with a package material 5, forming a semiconductor package 14. Referring to FIG. 12R, solder balls 11 may be formed at openings in the protective layer 21 (e.g., on pads of the lower circuit layer 1), available for an external connection.

Thus has been described a substrate including a conductive layer with two circuit layers formed therein, where the techniques described provide for more dense trace routing, increased I/O connections, improved yield in circuit etching, and greater design flexibility.

As used herein and not otherwise defined, the term "substantially" is used to describe and account for small variations. For example, the terms can refer to less than or equal to ±10%, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially in the same plane if a displacement between the two surfaces is no greater than 5 µm, no greater than 2 µm, no greater than 1 µm, or no greater than 0.5 µm.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily be drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A polymer substrate having a top surface and a bottom surface, comprising:
   a partially embedded first trace structure extending from an edge of the polymer substrate comprising:
      a first conductive pad having a first upper surface exposed from the top surface of the polymer substrate and a first lower surface opposite to the first upper surface; and
      a first conductive trace having a third upper surface facing the top surface of the polymer substrate and a third lower surface opposite to the third upper surface, wherein the first upper surface of the first conductive pad and the third upper surface of the first conductive trace are substantially coplanar; and
   a partially embedded second trace structure comprising:
      a second conductive trace having a second lower surface facing the bottom surface of the polymer substrate and a second upper surface opposite to the second lower surface, wherein the first lower surface is directly connected and substantially coplanar with the second upper surface, wherein the first conductive pad only partially overlaps the second conductive trace such that a side surface of the first conductive pad, which intersects the first upper surface, curves into the second upper surface.

2. The polymer substrate according to claim 1, wherein the first conductive trace and the second conductive trace are separate in a plane perpendicular to at least one of the top surface of the polymer substrate and the bottom surface of the polymer substrate.

3. The polymer substrate according to claim 1, wherein an electrical connect to the second conductive trace is absent on the first conductive trace.

4. The polymer substrate according to claim 1, wherein the first conductive pad and the second conductive trace are integrally formed.

5. The polymer substrate according to claim 1, wherein the partially embedded second trace structure further comprises a second conductive pad exposed from the bottom surface of the polymer substrate; and
a fourth upper surface of the second conductive pad and the third lower surface of the first conductive trace are in direct contact.

6. The polymer substrate according to claim 1, wherein the partially embedded second trace structure further comprises a second conductive pad exposed from the bottom surface of the polymer substrate; and
the first conductive trace and the second conductive trace are disposed between any two of the first conductive pad and the second conductive pad and are spaced from the first conductive pad and the second conductive pad by a distance.

7. The polymer substrate according to claim 1, wherein the third lower surface of the first conductive trace and the second upper surface of the second conductive trace are substantially coplanar.

8. The polymer substrate according to claim 1, wherein the partially embedded second trace structure further comprises a second conductive pad exposed from the bottom surface of the polymer substrate; and
a fourth lower surface of the second conductive pad and the second forth lower surface of the second conductive trace are substantially coplanar.

9. The polymer substrate according to claim 1, wherein the partially embedded second trace structure further comprises a second conductive pad exposed from the bottom surface of the polymer substrate; and
the first lower surface of the first conductive pad, the second upper surface of the second conductive trace, the third lower surface of the first conductive trace, and the fourth upper surface of the second conductive pad are substantially coplanar.

10. The polymer substrate according to claim 1, wherein the first conductive pad has a first curve having a first center of curvature and the first conductive trace has a second curve having a second center of curvature, wherein the first center of curvature and the second center of curvature are at the same side of the third lower surface of the first conductive trace.

11. The polymer substrate according to claim 1, wherein the second conductive trace has a third curve having a third center of curvature and the first conductive trace has a second curve having a second center of curvature, wherein the third center of curvature and the second center of curvature are at the opposite sides of the third lower surface of the first conductive trace.

12. The polymer substrate according to claim 1, further comprising a first protective layer having a fifth lower surface, and a second protective layer having a sixth upper surface, wherein the fifth lower surface and the sixth upper surface are substantially coplanar, and the fifth lower surface and the first lower surface of the first conductive pad are substantially coplanar.

13. The polymer substrate according to claim 12, wherein the first protective layer is in contact with the second protective layer and the fifth lower surface and the sixth upper surface are substantially coplanar.

14. The polymer substrate according to claim 12, wherein the first conductive pad is exposed from the first protective layer.

15. The polymer substrate according to claim 12, wherein the partially embedded second trace structure further comprises a second conductive pad exposed from the bottom surface of the polymer substrate; and
the second conductive pad is exposed from the second protective layer.

16. The polymer substrate according to claim 1, wherein the first upper surface of the first conductive pad is in contact with a surface finish layer.

17. A semiconductor package, comprising:
a polymer substrate having a top surface and a bottom surface, comprising:
a partially embedded first trace structure extending from an edge of the polymer substrate comprising:
a first conductive pad having a first upper surface exposed from the top surface of the polymer substrate and a first lower surface opposite to the first upper surface; and
a first conductive trace having a third upper surface facing the top surface of the polymer substrate and a third lower surface opposite to the third upper surface, wherein the first upper surface of the first conductive pad and the third upper surface of the first conductive trace are substantially coplanar; and
a partially embedded second trace structure comprising:
a second conductive trace having a second lower surface facing the bottom surface of the polymer substrate and a second upper surface opposite to the second lower surface, wherein the first lower surface is directly connected and substantially coplanar with the second upper surface; and
a surface finish layer in contact with the first upper surface; and
a semiconductor component electrically connected to the surface finish layer through a wire, wherein the first conductive pad only partially overlaps the second conductive trace such that a side surface of the first conductive pad, which intersects the first upper surface, curves into the second upper surface.

18. The semiconductor package according to claim 17, wherein
the partially embedded second trace structure further comprises a second conductive pad exposed from the bottom surface of the polymer substrate; and
a solder ball electrically connects to the second conductive pad.

* * * * *